(12) United States Patent
Inoue et al.

(10) Patent No.: US 8,710,626 B2
(45) Date of Patent: Apr. 29, 2014

(54) SEMICONDUCTOR DEVICE HAVING TRAPEZOIDAL SHAPED TRENCHES

(75) Inventors: Ayako Inoue, Chiba (JP); Naoto Saitoh, Chiba (JP)

(73) Assignee: Seiko Instruments Inc., Chiba (JP)

(*) Notice: Subject to any disclaimer, the term of this patent is extended or adjusted under 35 U.S.C. 154(b) by 0 days.

(21) Appl. No.: 13/552,172

(22) Filed: Jul. 18, 2012

(65) Prior Publication Data

US 2012/0280359 A1 Nov. 8, 2012

Related U.S. Application Data

(62) Division of application No. 13/070,267, filed on Mar. 23, 2011, now Pat. No. 8,247,303.

(30) Foreign Application Priority Data

Mar. 25, 2010 (JP) ................... 2010-071085

(51) Int. Cl.
*H01L 21/02* (2006.01)

(52) U.S. Cl.
USPC .............. 257/534; 257/516; 257/E29.342

(58) Field of Classification Search
USPC ......... 257/516, 532, 300–303, 306, 308, 534, 257/E29.342; 438/242, 243, 253, 369
See application file for complete search history.

(56) References Cited

U.S. PATENT DOCUMENTS 5,111,259 A * 5/1992 Teng et al. ................. 257/301

FOREIGN PATENT DOCUMENTS

JP          07-263692 A    10/1995

* cited by examiner

*Primary Examiner* — Chuong A Luu
*Assistant Examiner* — Nga Doan
(74) *Attorney, Agent, or Firm* — Brinks Gilson & Lione

(57) ABSTRACT

Provided is a semiconductor capacitor including: a capacitor device forming region having a trapezoidal trench which is formed on a surface of a first conductivity type semiconductor substrate; a second conductivity type lower electrode layer provided along the trapezoidal trenches of the capacitor device forming region; a capacitor insulating film formed at least on a surface of the second conductivity type lower electrode layer; and a second conductivity type upper electrode formed on a surface of the capacitor insulating film.

2 Claims, 6 Drawing Sheets

PRIOR ART    FIG. 4A
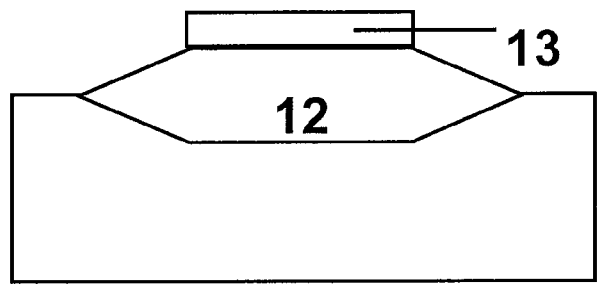
PRIOR ART    FIG. 4B
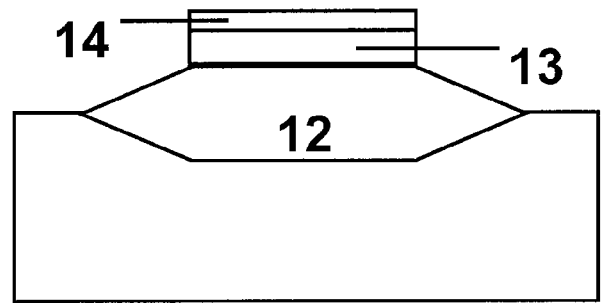
PRIOR ART    FIG. 4C
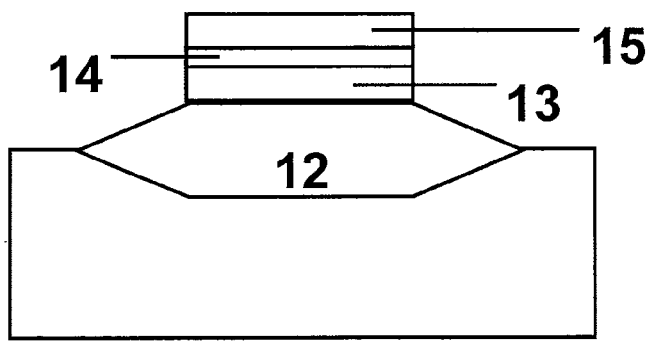

PRIOR ART FIG. 5A
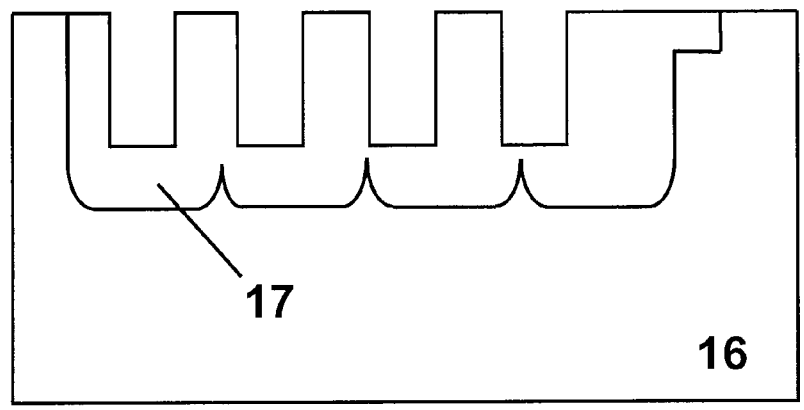
PRIOR ART FIG. 5B
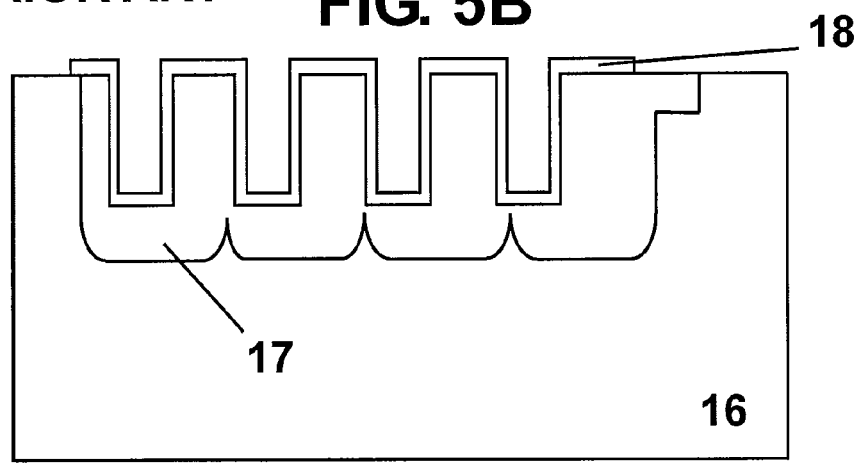
PRIOR ART FIG. 5C
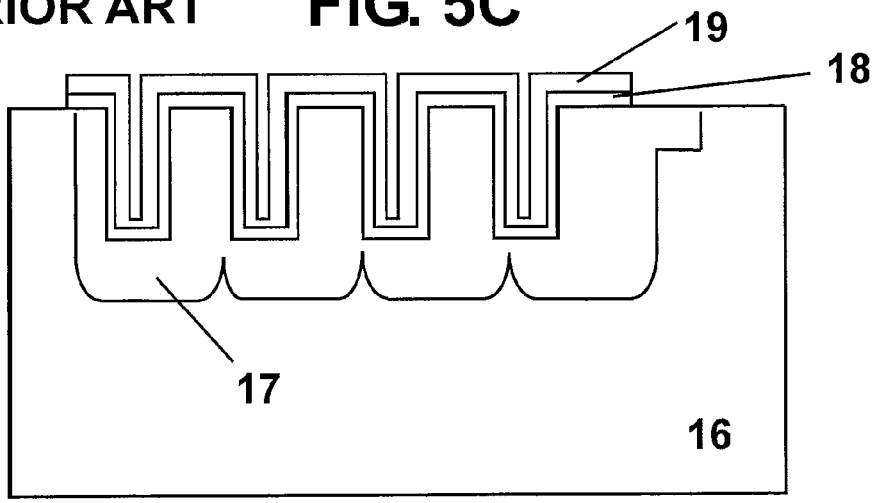

SEMICONDUCTOR DEVICE HAVING TRAPEZOIDAL SHAPED TRENCHES

RELATED APPLICATIONS

This application is a divisional of U.S. patent application Ser. No. 13/070,267, filed Mar. 23, 2011, now U.S. Pat. No. 8,247,303, which claims priority under 35 U.S.C. §119 to Japanese Patent Application No. 2010-071085 filed on Mar. 25, 2010, the entire content of which is hereby incorporated by reference.

BACKGROUND OF THE INVENTION

1. Field of the Invention

The present invention relates to a semiconductor device including a semiconductor capacitor and a method of manufacturing the semiconductor device.

2. Description of the Related Art

A semiconductor capacitor, which is one of the key components of a semiconductor circuit, is incorporated in various kinds of ICs, and semiconductor capacitors having various structures are used. Conventional semiconductor capacitors include planar capacitors. A typical planar capacitor structure and a method of manufacturing the structure are described for a capacitor formed on a P-type semiconductor substrate as an example with reference to sectional views of FIGS. 3A to 3C illustrating manufacturing processes.

First, as illustrated in FIG. 3A, N-type impurities are implanted by ion implantation into a surface of a P-type semiconductor substrate 8, which is then subjected to heat treatment to form a lower electrode layer 9. Next, as illustrated in FIG. 3B, a surface of the lower electrode layer 9 is thermally oxidized to form a capacitor insulating film 10. Next, as illustrated in FIG. 3C, an upper electrode 11 is formed by: depositing a polycrystalline silicon film through CVD or the like on the capacitor insulating film 10; subjecting the polycrystalline silicon film to ion implantation of N-type impurities and heat treatment; and patterning the polycrystalline silicon film into the upper electrode 11. This sums up a typical structure of conventional planar capacitors and a method of manufacturing the structure. Since planar capacitors can be formed at a low cost without difficulty by utilizing a commonly employed manufacturing process for a transistor, they are widely used.

A drawback of planar capacitors is that the capacitance value is unstable because the width of a depletion layer on the surface of the lower electrode layer is varied depending on the input voltage, and the variations in depletion layer width lead to fluctuations in capacitance value.

This drawback is addressed in some of conventional semiconductor capacitors, and PIP (Polycrystalline silicon-Insulator-Polycrystalline silicon) stacked capacitors are one of those semiconductor capacitors. A typical PIP stacked capacitor structure and a method of manufacturing the structure are described with reference to sectional views of FIGS. 4A to 4C illustrating manufacturing processes, taking a capacitor that is formed on a field oxide film as an example.

First, as illustrated in FIG. 4A, a lower electrode 13 is formed by: depositing a polycrystalline silicon film through CVD or the like on a field oxide film 12; subjecting the polycrystalline silicon film to ion implantation of N-type impurities and subsequently to heat treatment; and patterning the polycrystalline silicon film into the lower electrode 13. Next, as illustrated in FIG. 4B, a capacitor insulating film 14 is formed by deposition through CVD on the lower electrode 13. Next, as illustrated in FIG. 4C, an upper electrode 15 is formed by: depositing a polycrystalline silicon film through CVD or the like on the capacitor insulating film 14; subjecting the polycrystalline silicon film to ion implantation of N-type impurities and heat treatment; and patterning the polycrystalline silicon film into the upper electrode 15. This sums up a typical structure of conventional PIP stacked capacitors and a method of manufacturing the structure. Compared to planar capacitors, stacked capacitors show a very small variation in depletion layer width against the input voltage and have a stable capacitance value since the lower electrode and the upper electrode are formed from polycrystalline silicon in which high-concentration impurities are added.

A problem of stacked capacitors lies in how the capacitor insulating film is formed on polycrystalline silicon. Generally speaking, setting the temperature higher in thermal oxidation of polycrystalline silicon yields an oxide film that has a better film quality. On the other hand, in thermal oxidation at a high temperature, heat during the oxidation process diffuses impurities, which can cause a characteristics change and decreased reliability in other devices (such as transistor). It is for this reason that CVD capable of forming an oxide film at a relatively low temperature is commonly used as a method of forming a capacitor insulating film in a PIP stacked capacitor. However, an oxide film formed by CVD is inferior in characteristics to a thermal oxide film formed on single-crystal silicon. This means that PIP stacked capacitors cannot have a thin capacitor insulating film because forming a thin oxide film by CVD causes deterioration in withstand voltage and reliability. PIP stacked capacitors consequently have a drawback in that the capacitance value cannot be increased.

Trench capacitors are one of semiconductor capacitors that have been proposed to address those drawbacks of planar capacitors and stacked capacitors.

A typical trench capacitor structure and a method of manufacturing the structure are described with reference to sectional views of FIGS. 5A to 5C illustrating manufacturing processes, taking a capacitor that is formed on a P-type semiconductor substrate as an example.

First, as illustrated in FIG. 5A, a lower electrode layer 17, which is formed into a lower electrode, is formed by ion implantation of N-type impurities and heat treatment on a P-type semiconductor substrate 16 where trenches have been formed. Next, as illustrated in FIG. 5B, a capacitor insulating film 18 is formed by thermal oxidation on the trench substrate surface where the lower electrode layer 17 has been formed. Next, as illustrated in FIG. 5C, an upper electrode 19 is formed by: depositing and forming a polycrystalline silicon film, which is formed into the upper electrode 19, through CVD or the like on the capacitor insulating film 18; subjecting the polycrystalline silicon film to ion implantation of N-type impurities and heat treatment; and patterning the polycrystalline silicon film. This sums up a typical structure of conventional trench capacitors and a method of manufacturing the structure.

Formation of the lower electrode layer on the trench substrate surface where a plurality of trenches have been formed as illustrated in FIG. 5C permits trench capacitors to suppress or limit an increase in width of a depletion layer, which is generated in a lower electrode layer surface, by adjusting the impurity concentration of the lower electrode layer or by adjusting the aspect ratio of the trenches and the distance between the trenches. Trench capacitors can consequently suppress a change in capacitance value due to a change in input voltage, which is a problem of planar capacitors. Trench capacitors, in which the capacitor insulating film is formed on a single-crystal silicon substrate, can also use thermal oxidation in forming an oxide film, and the capacitor insulating film can thus be formed thin. This means that the capacitance value can be increased, which makes trench capacitors more advantageous than stacked capacitors. Further, trench capacitors can have a large capacitance by adjusting the aspect ratio and number of the trenches.

Trench capacitors, however, are angular at trench openings and trench bottoms, thickness of the capacitor insulating film and the polycrystalline silicon film for the upper electrode formed on the trenches becomes thin around the trench openings and in the corners of the trench bottoms. The resultant drawback is that trench capacitors are susceptible to dielectric breakdown due to field concentration around the trench openings and in the trench bottom corners where the capacitor insulating film and the polycrystalline silicon film are thin, and are accordingly lowered in reliability.

A method that addresses this drawback by rounding trench openings and trench bottoms has been proposed (see JP 07-263692 A, for example). A method involving rounding trench openings and trench bottoms is described with reference to sectional views of FIGS. 6A to 6C illustrating manufacturing processes. While JP 07-263692 A describes a case of forming a MOSFET on a trench substrate, the method involving rounding trench openings and trench bottoms is made applicable by omitting the process of forming source and drain regions and replacing the transistor's gate oxide film with a capacitor insulating film.

A surface of a semiconductor substrate 20 is oxidized. The resultant oxide film on the substrate surface is partially removed and then a trench is formed in the semiconductor substrate 20. Thereafter, a sacrificial oxide film 21 is formed inside the trench by thermal oxidation. The semiconductor substrate 20 in this state is illustrated in section in FIG. 6A. Next, the sacrificial oxide film 21 is removed as illustrated in FIG. 6B. Subsequently, as illustrated in FIG. 6C, the semiconductor substrate surface from which the sacrificial oxide film 21 has been removed is subjected to thermal oxidation at 1,000° C. or higher (for example, 1,215° C.) in an oxygen atmosphere to form an oxide film 22 (gate oxide film in JP 07-263692 A).

According to JP 07-263692 A, trench openings and trench bottoms can be rounded by executing once a process of forming an oxide film by performing thermal oxidation at 1,000° C. or higher in an oxygen atmosphere after trenches are formed and removing the oxide film formed through thermal oxidation, or by repeating the process twice. With the trench openings and trench bottoms rounded, field concentration in the angular portions of the trenches is avoided.

However, the method which requires executing once or twice the process of forming an oxide film at a high temperature of 1,000° C. or higher in an oxygen atmosphere and removing the oxide film in order to round trench openings and trench bottoms has a problem in that the high temperature heat treatment makes the substrate susceptible to damage such as dislocation. Another problem is that the high temperature heat treatment causes re-distribution in an already formed impurity layer and accordingly raises the possibility of increased variation in impurity concentration.

SUMMARY OF THE INVENTION

An object of the present invention is therefore to provide a semiconductor capacitor that can be formed without high temperature heat treatment and that has less chance of reliability degradation while being stable in capacitance value and capable of increasing the capacitance as in conventional trench capacitors, and to provide a method of manufacturing the semiconductor capacitor.

According to the present invention, in order to attain the above-mentioned object, the following measures are employed. First, there is provided a semiconductor device including: a capacitor device forming region having a trapezoidal trench which is formed on a surface of the first conductivity type semiconductor substrate; the second conductivity type lower electrode layer provided along the trapezoidal trench of the capacitor device forming region; a capacitor insulating film formed on at least a surface of the second conductivity type lower electrode layer; and a second conductivity type upper electrode formed on a surface of the capacitor insulating film.

Further, in the semiconductor device, the trapezoidal trench includes a plurality of trapezoidal trenches, and the plurality of trapezoidal trenches is arranged parallel to one another.

Further, there is employed a method of manufacturing a semiconductor device, including: forming oxide films by LOCOS on a first conductivity type semiconductor substrate to form thick oxide film regions and thin oxide film regions; removing the oxide films of the thick oxide film regions and the thin oxide film regions from the first conductivity type semiconductor substrate; introducing second conductivity type impurities to a surface of a trapezoidal trench, to thereby form a lower electrode layer; forming a capacitor insulating film at least on the lower electrode layer; depositing and forming a polycrystalline silicon film, which is formed into an upper electrode, on the capacitor insulating film; and introducing second conductivity type impurities to the polycrystalline silicon film, which is formed into the upper electrode, and patterning the polycrystalline silicon film into a given shape, to thereby form the upper electrode.

Further, there is employed the method of manufacturing a semiconductor device, in which the forming a capacitor insulating film includes forming an oxide film by thermal oxidation.

Further, there is employed the method of manufacturing a semiconductor device, in which the forming a capacitor insulating film includes forming a silicon nitride film by reduced-pressure CVD.

The present invention provides a semiconductor capacitor that can be formed without high temperature heat treatment and that has less chance of reliability degradation while being stable in capacitance value and capable of increasing the capacitance as in conventional trench capacitors, and a method of manufacturing the semiconductor capacitor, by applying local oxidation of silicon (LOCOS), which is an existing device isolation technology, and forming a LOCOS trench substrate.

BRIEF DESCRIPTION OF THE DRAWINGS

In the accompanying drawings:

FIGS. 4A to 4C are sectional views schematically illustrating a structure of a conventional stacked capacitor and manufacturing processes of the capacitor;

FIGS. 5A to 5C are sectional views schematically illustrating a structure of a conventional trench capacitor and manufacturing processes of the capacitor.

DETAILED DESCRIPTION OF THE PREFERRED EMBODIMENT

An embodiment of the present invention is described below in detail.

FIGS. 1A to 1C and FIGS. 2A to 2C are sectional views illustrating manufacturing processes for illustrating a semiconductor device and a method of manufacturing the semiconductor device according to this embodiment. This embodiment takes as an example a capacitor device that uses a P-type semiconductor substrate. However, the essence of the present invention does not depend on the conductivity type of the employed substrate and the type and conductivity type of the employed impurities. The present invention can therefore be carried out the same way as in the embodiment when the conductivity type of the employed substrate and the type and conductivity type of the employed impurities differ from those in the embodiment.

The structure of the semiconductor device and the method of manufacturing the semiconductor device according to this embodiment are described below with reference to the sectional views of FIGS. 1A to 1C and FIGS. 2A to 2C illustrating manufacturing processes.

Figure 1A:
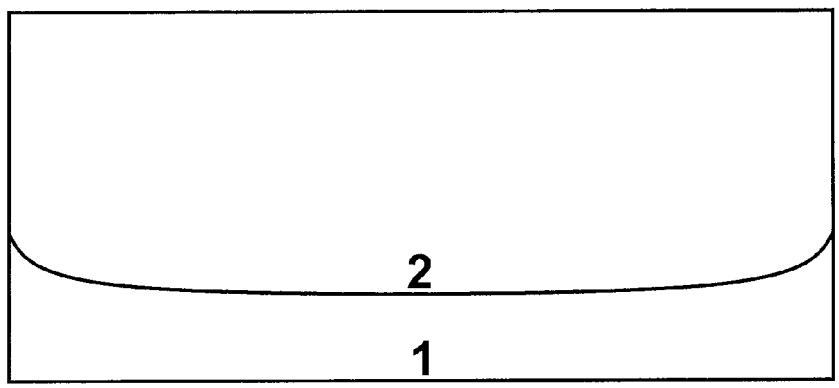
FIGS. 1A to 1C are sectional views schematically illustrating a structure of a semiconductor capacitor and manufacturing processes of the semiconductor capacitor according to the present invention.

First, as illustrated in FIG. 1A, a P-type well 2 is formed on a P-type semiconductor substrate 1 in which P-type impurities (for example, boron) are added at an impurity concentration that gives the semiconductor substrate 1 a resistivity of 20 to 30 Ω·cm. The P-type well 2 is formed by performing ion implantation of P-type impurities (for example, boron) at a dose of $1\times10^{11}$ to $1\times10^{13}$ atoms/cm$^2$ and diffusing the P-type impurities through heat treatment. The presence or absence of the well is irrelevant to the essence of this embodiment, and the capacitor device may therefore be formed directly on a semiconductor substrate without forming a well.

Figure 1B:
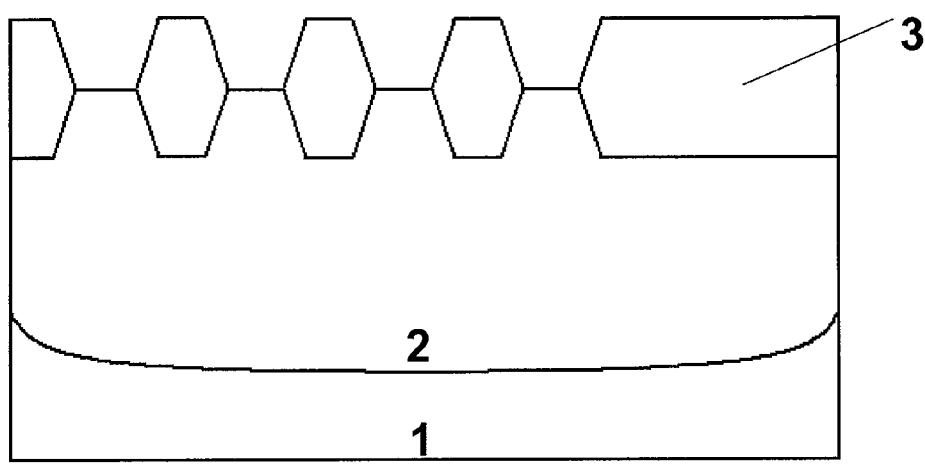

Next, as illustrated in FIG. 1B, local oxidation of silicon (LOCOS) which is an existing device isolation technology is used to form a thick oxide film 3 by thermal oxidation to a thickness of 0.2 μm to 4.0 μm on portions of the substrate surface where the P-type well 2 has been formed. The oxide film 3 is formed such that thick oxide film regions and thin oxide film regions are next to and parallel to each other. The number of the regions where the thick oxide film 3 is not formed (thin oxide film regions) and a width of the gap between the thin oxide film regions are determined to suit the capacitance of the capacitor device to be manufactured and the degree of suppression of the widening of the depletion layer width.

Figure 1C:
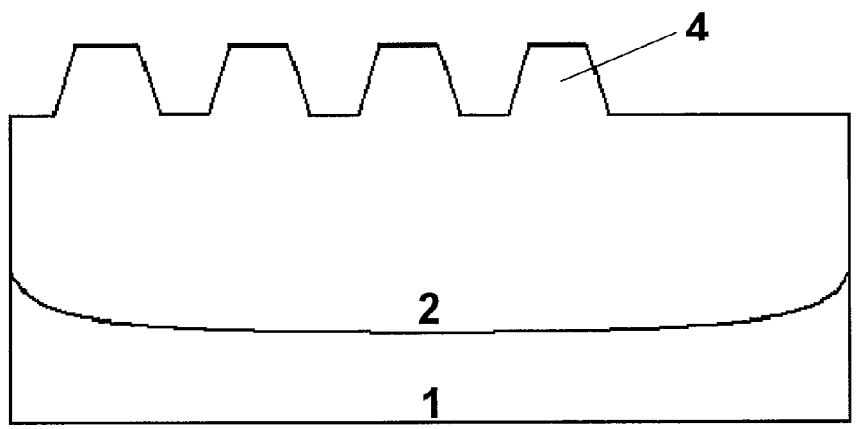

Next, as illustrated in FIG. 1C, the oxide films on the surface are all removed by wet etching to form a plurality of LOCOS trench capacitor device forming regions 4 on the silicon substrate surface. The LOCOS trench capacitor device forming regions 4 each have a trapezoidal shape.

Figure 2A:
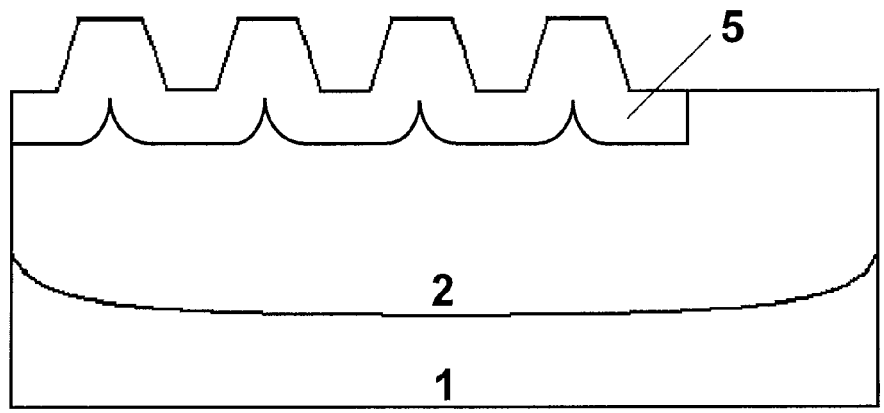
FIGS. 2A to 2C are sectional views schematically illustrating a structure of the semiconductor capacitor and manufacturing processes of the semiconductor capacitor that are a continuation of FIGS. 1A to 1C, according to the present invention.

Next, as illustrated in FIG. 2A, a lower electrode layer 5 is formed by performing high concentration ion implantation of N type impurities (for example, arsenic) on the substrate surface in the capacitor device forming regions at a dose of $5\times10^{13}$ to $1\times10^{15}$ atoms/cm$^2$. The lower electrode layer 5 is provided along the trapezoidal trenches on the semiconductor substrate surface in the capacitor device forming regions 4, which are on a surface of the P-type well 2 formed on the semiconductor substrate 1.

Figure 2B:
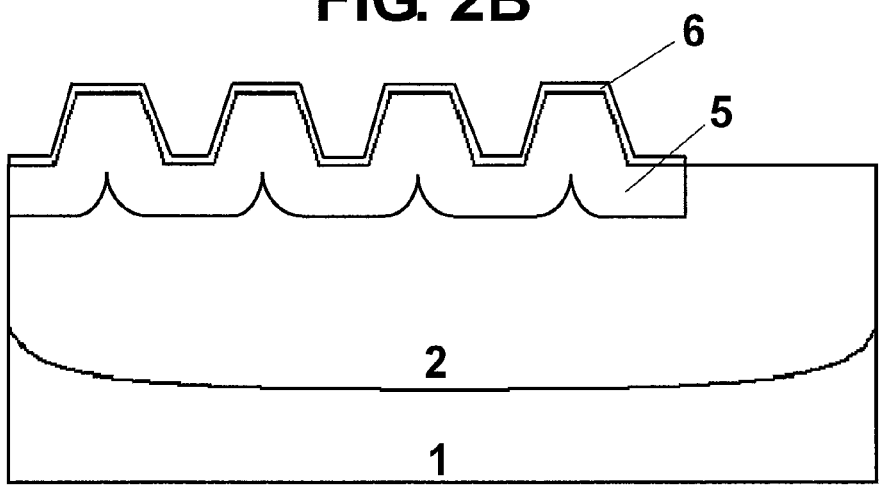

Next, as illustrated in FIG. 2B, an oxide film, which is formed into a capacitor insulating film 6, is formed by thermal oxidation on a surface of the lower electrode layer 5 to a thickness of, for example, several tens nm to 1 μm. The capacitor insulating film 6 is not limited to a thermal oxide film and may be a silicon nitride film, in which case the capacitor insulating film 6 is formed preferably by reduced-pressure CVD so as to cover surfaces of the trapezoidal trenches in a uniform manner.

Figure 2C:
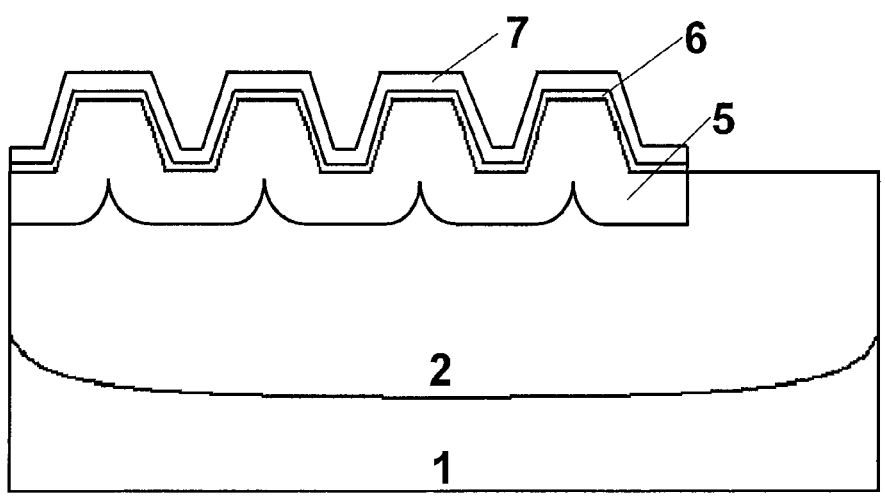
Figure 3A:
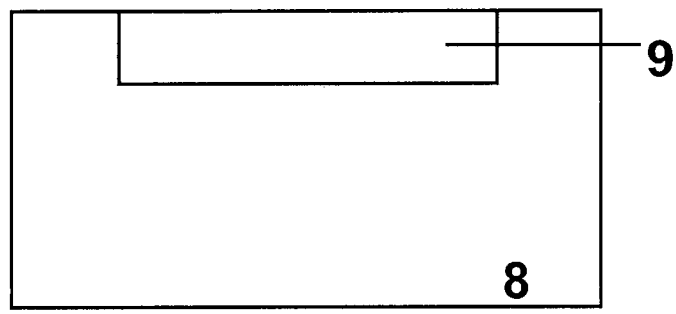
FIGS. 3A to 3C are sectional views schematically illustrating a structure of a conventional planar capacitor and manufacturing processes of the capacitor.
Figure 3B:
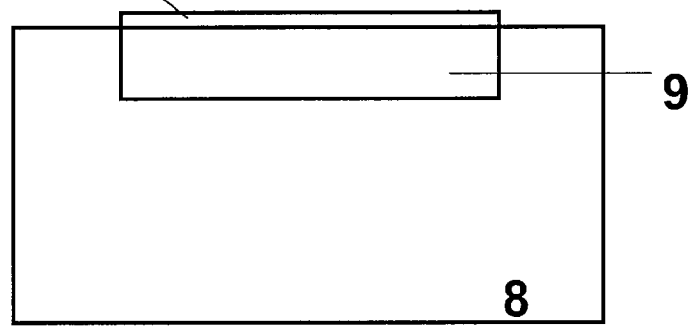
Figure 3C:
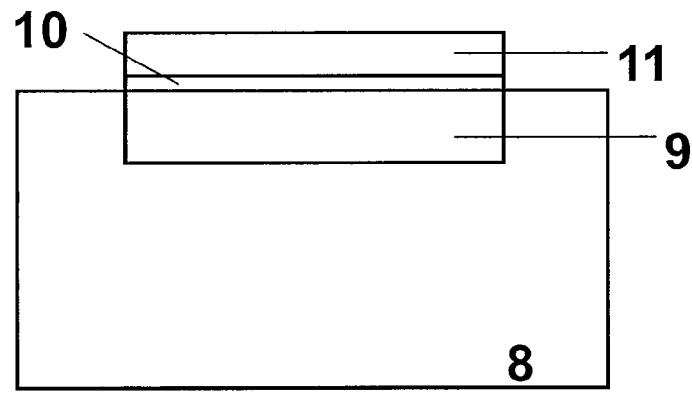
Figure 6A:
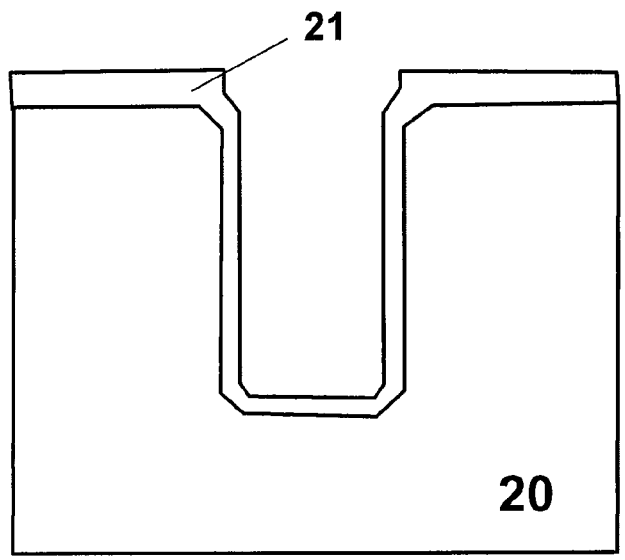
FIGS. 6A to 6C are sectional views schematically illustrating a method of rounding trench openings and trench bottoms according to JP 07-263692 A.
Figure 6B:
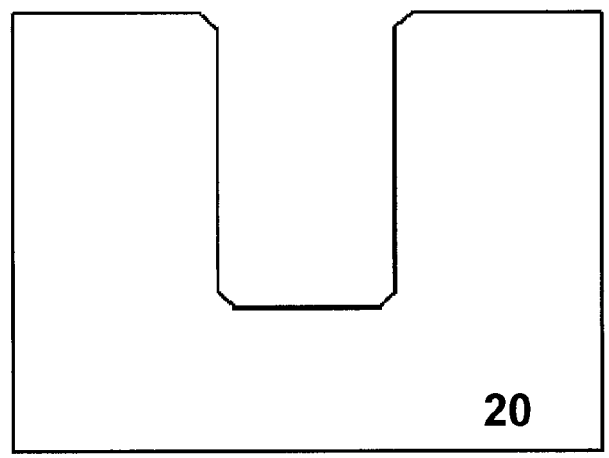
Figure 6C:
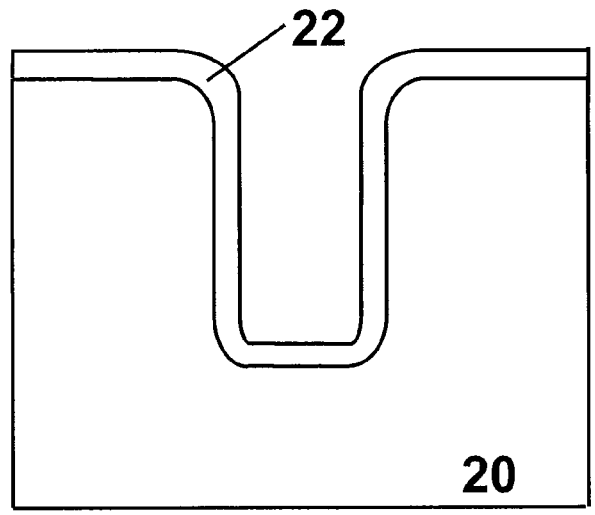

Next, as illustrated in FIG. 2C, an upper electrode 7 of the capacitor device is formed by: depositing polycrystalline silicon on a surface of the capacitor insulating film 6; performing ion implantation of N-type impurities (for example, phosphorus) at a dose of $1\times10^{15}$ to $1\times10^{16}$ atoms/cm$^2$; and then patterning. The impurity introducing step may use pre-deposition instead of ion implantation. Forming electrode wiring and subsequent steps which follow the forming of the upper electrode 7 (process of forming metal wiring and a protective film) are the same as in a common semiconductor device manufacturing method, and hence detailed descriptions on those steps are omitted. The structure of a semiconductor device and a method of manufacturing the semiconductor device according to this embodiment have now been described.

This embodiment described above has the following effects.

Compared to conventional trenches, the LOCOS trenches formed by LOCOS, which is an existing device isolation technology, and wet etching are not sharp around the trench openings and do not have sharp corners at the bottom, and are therefore less susceptible to dielectric breakdown or the like caused by field concentration in angular portions which lowers the reliability. In addition, because the LOCOS trenches do not have angular portions that need to be rounded, the semiconductor capacitor of this embodiment can be formed without high temperature heat treatment which causes damage such as dislocation in the substrate.

This embodiment can also suppress depletion layer width variation, which depends on the input voltage, by adjusting the impurity concentration of the lower electrode layer and the gap between the LOCOS trenches. As a result, the capacitance value is stabilized.

Further, with the capacitor insulating film formed on a single-crystal silicon substrate, a thermal oxide film that has a high film quality can be used, which allows the capacitor insulating film to be thin. The semiconductor capacitor of this embodiment can therefore have a larger capacitance than that of PIP stacked capacitors.

The capacitance can be increased also by adjusting the number and depth of the LOCOS trenches.

What is claimed is:
1. A semiconductor device comprising:
    a first conductivity type single-crystal semiconductor substrate;
    a capacitor device region in the first conductivity type single-crystal semiconductor substrate and having a surface including a recess bounded by a planar plateau, where the recess includes oxygen-reacted sidewalls aligned with crystal planes of the semiconductor substrate and rounded features, such that the recess defines a trapezoidal shaped trench in the semiconductor substrate;

a second conductivity type lower electrode layer in the planar plateau and the oxygen-reacted sidewalls of the trapezoidal shaped trench;

a capacitor insulating film on a surface of the second conductivity type lower electrode layer; and a second conductivity type upper electrode layer on a surface of the capacitor insulating film.

2. A semiconductor device according to claim 1, wherein the surface comprises a corrugated surface including a series of recesses separated by the planar plateau, such that a plurality of trapezoidal trenches reside in parallel to one another in the capacitor device region.

\* \* \* \* \*